US009331262B2

United States Patent
Maejima et al.

(10) Patent No.: US 9,331,262 B2
(45) Date of Patent: May 3, 2016

(54) THIN FILM PIEZOELECTRIC ELEMENT, THIN FILM PIEZOELECTRIC ACTUATOR, THIN FILM PIEZOELECTRIC SENSOR, HARD DRIVE DISK, AND INKJET PRINTER DEVICE

(71) Applicant: TDK CORPORATION, Tokyo (JP)

(72) Inventors: Kazuhiko Maejima, Tokyo (JP); Yasuhiro Aida, Tokyo (JP); Yoshitomo Tanaka, Tokyo (JP); Katsuyuki Kurachi, Tokyo (JP); Hitoshi Sakuma, Tokyo (JP)

(73) Assignee: TDK CORPORATION, Tokyo (JP)

( * ) Notice: Subject to any disclaimer, the term of this patent is extended or adjusted under 35 U.S.C. 154(b) by 515 days.

(21) Appl. No.: 13/898,110

(22) Filed: May 20, 2013

(65) Prior Publication Data

US 2014/0339961 A1   Nov. 20, 2014

(51) Int. Cl.
| | | |
|---|---|---|
| *H01L 41/187* | (2006.01) | |
| *C04B 35/00* | (2006.01) | |
| *H01L 41/08* | (2006.01) | |
| *B41J 2/14* | (2006.01) | |
| *G01L 9/00* | (2006.01) | |

(Continued)

(52) U.S. Cl.
CPC ......... *H01L 41/0805* (2013.01); *B41J 2/14233* (2013.01); *B41J 2/161* (2013.01);

(Continued)

(58) Field of Classification Search
CPC ... H01L 41/187; H01L 41/18; H01L 41/0926; H01L 41/22; H01L 41/083; C04B 35/46; C04B 35/48; C04B 35/50; C04B 35/51
USPC .................................. 310/358; 252/62.9 PZ
See application file for complete search history.

(56) References Cited

U.S. PATENT DOCUMENTS

| 5,753,934 A | 5/1998 | Yano et al. |
|---|---|---|
| 5,801,105 A | 9/1998 | Yano et al. |

(Continued)

FOREIGN PATENT DOCUMENTS

| JP | A-09-110592 | 4/1997 |
|---|---|---|
| JP | A-10-182300 | 7/1998 |
| JP | A-2008-159807 | 7/2008 |

OTHER PUBLICATIONS

Lee at al., "Effect of Mn substitution on ferroelectric and leakage current characteristics of lead-free $(K_{0.5}NA_{0.5})(Mn_xNb_{1-x})O_3$ thin films," *Current Applied Physics*, 2011, pp. S266-S269, vol. 11, Elsevier B.V.

(Continued)

*Primary Examiner* — Thomas Dougherty
(74) *Attorney, Agent, or Firm* — Oliff PLC

(57) ABSTRACT

A thin film piezoelectric element according to the present invention includes a potassium sodium niobate thin film having a structure in which a plurality of crystal grains are present in a film thickness direction; and a pair of electrode films sandwiching the potassium sodium niobate thin film. When the potassium sodium niobate thin film is divided into three regions of the same thickness in the film thickness direction and average crystal grain sizes $A_1$, $A_2$, and $A_3$ of the respective regions are determined, a ratio m/M of the smallest average crystal grain size m among $A_1$, $A_2$, and $A_3$ to the largest average crystal grain size M among $A_1$, $A_2$, and $A_3$ is 10% to 80%. The region having the smallest average crystal grain size m lies next to one of the pair of electrode films.

9 Claims, 13 Drawing Sheets

(51) Int. Cl.
  *G11B 5/55* (2006.01)
  *H01L 41/316* (2013.01)
  *B41J 2/16* (2006.01)
  *G01C 19/5621* (2012.01)
  *G01C 19/5628* (2012.01)

(52) U.S. Cl.
  CPC ............ *B41J 2/1628* (2013.01); *B41J 2/1629* (2013.01); *B41J 2/1631* (2013.01); *B41J 2/1632* (2013.01); *B41J 2/1646* (2013.01); *G01C 19/5621* (2013.01); *G01C 19/5628* (2013.01); *G01L 9/008* (2013.01); *G11B 5/5552* (2013.01); *H01L 41/1873* (2013.01); *H01L 41/316* (2013.01); *B41J 2202/03* (2013.01)

(56) References Cited

U.S. PATENT DOCUMENTS 8,063,543 B2    11/2011  Shibata et al.
2013/0306902 A1*  11/2013  Beck et al. ............... 252/62.9 R
2014/0049138 A1*  2/2014  Shiraki ........................ 310/330

OTHER PUBLICATIONS

Wang et al., "Enhanced ferroelectric properties in Mn-doped $K_{0.5}Na_{0.5}NbO_3$ thin films derived from chemical solution deposition," *Applied Physics Letters*, 2010, pp. 072902-1-072902-3, vol. 97, No. 072902, American Institute of Physics, USA.

* cited by examiner

THIN FILM PIEZOELECTRIC ELEMENT, THIN FILM PIEZOELECTRIC ACTUATOR, THIN FILM PIEZOELECTRIC SENSOR, HARD DRIVE DISK, AND INKJET PRINTER DEVICE

BACKGROUND OF INVENTION

1. Field of Invention

The present invention relates to a thin film piezoelectric element that uses a thin film piezoelectric material, a thin film piezoelectric actuator and a thin film piezoelectric sensor that use the thin film piezoelectric element, and a hard disk drive and an ink jet printer that include the thin film piezoelectric actuator.

2. Background Art

With the increasing demand for lead-free piezoelectric materials in recent years, studies on potassium sodium niobate (($K,Na)NbO_3$ (also referred to as KNN hereinafter)) have been actively pursued. KNN is attracting much attention since it has a relatively high Curie temperature among lead-free piezoelectric materials and offers favorable piezoelectric properties.

Meanwhile, commercialization of piezoelectric elements that use thin film piezoelectric materials instead of bulk piezoelectric materials is progressing. Examples thereof include piezoelectric sensors, such as gyro sensors, pressure sensors, pulse wave sensors, shock sensors, and microphones, that use the piezoelectric effect of converting a force applied to a piezoelectric thin film into a voltage; piezoelectric actuators, such as hard disk drive head assemblies and ink jet print heads, that use the inverse piezoelectric effect of a piezoelectric thin film deforming when a voltage is applied to the piezoelectric thin film; and other devices that similarly use the inverse piezoelectric effect, such as speakers, buzzers, and resonators.

Piezoelectric materials made into thin films enable size-reduction of elements and widen the field of application of piezoelectric materials. Moreover, since a large number of elements can be fabricated on a substrate at the same time, suitability for mass production is enhanced. There are also many advantages in terms of performance, such as improved sensitivity when thin film piezoelectric materials are used in sensors.

Patent Literature 1 describes that a piezoelectric thin film composed of a perovskite-type or tungsten-bronze-type material and having a purely c-plane orientation can be formed by forming the piezoelectric thin film on an oxide thin film on a single crystal silicon substrate, and that piezoelectric properties optimum for devices can thus be obtained.

Patent Literature 2 describes a potassium sodium niobate thin film (KNN thin film) that achieves a stable, high piezoelectric property −d31, in which the majority of crystal grains constituting the piezoelectric thin film have a columnar structure that is longer in the thickness direction than in the substrate surface direction and the average crystal grain size in the surface direction is 0.1 µm or more and 1 µm or less.

Patent Literature 3 describes that a dielectric thin film formed by a MOCVD method is annealed in an oxidizing gas atmosphere containing ozone to decrease the number of defects in the network structure of the dielectric thin film and that the leakage current is reduced as a result.

Non Patent Literature 1 and Non Patent Literature 2 describe that adding Mn to a potassium sodium niobate thin film (KNN thin film) decreases the hole density and the number of oxygen vacancies and that the leakage current properties are improved as a result.

[Patent Literature 1] Japanese Unexamined Patent Application Publication No. 09-110592
[Patent Literature 2] Japanese Unexamined Patent Application Publication No. 2008-159807
[Patent Literature 3] Japanese Unexamined Patent Application Publication No. 10-182300
[Non Patent Literature 1] Lee et al: Current Applied Physics 11 (2011) S266
[Non Patent Literature 2] Wang et al: Applied Physics Letters 97, 072902 (2010)

SUMMARY OF INVENTION

As described in Patent Literature 2, the average crystal grain size of the crystal grains constituting a KNN thin film must be adjusted to be within an appropriate range in order for a KNN thin film to achieve practical piezoelectric properties.

However, when the crystal grain size is large and oxygen vacancies occur in the crystal grain boundaries formed in the film thickness direction (a direction perpendicular to an electrode film), the crystal grain boundaries act as passages for an electrical current and there is an increased risk that the leakage current between the electrode films will increase. A schematic diagram of a cross-section of a KNN thin film in which the average crystal grain size is higher than the appropriate range and the leakage current is increased is shown in FIG. 2A. An actual image observed with a transmission electron microscope (referred to as TEM hereinafter) is shown in FIG. 2B and an image in which crystal grain boundaries 106 acting as leakage current passages in a piezoelectric thin film 103 of FIG. 2B are highlighted is shown in FIG. 2C.

As shown in FIG. 2A, crystal grains constituting the piezoelectric thin film 103 formed on a substrate 101 and sandwiched between upper and lower electrode films 102 and 104 are large crystals each extending between the upper and lower electrode films 102 and 104 and are partitioned from each other by the crystal grain boundaries 106. However, referring to FIG. 2B which is an actual TEM observation image of a piezoelectric thin film 103 having crystals as large as ones shown in FIG. 2A, some of the crystal grain boundaries 106 act as leakage current passages as shown in FIG. 2C and the leakage current density of this thin film piezoelectric element exceeds the practical upper limit of $1 \times 10^{-5}$ A/cm². Thus, this thin film piezoelectric element is not practically applicable.

The increasing leakage current has been a major concern with regard to fabrication of and reliability of thin film piezoelectric elements. A typical countermeasure has been to conduct annealing after fabrication of piezoelectric thin films as described in Patent Literature 3. However, where dielectric thin films obtained by a sputtering method are concerned, it is difficult to eliminate all oxygen vacancies in the crystal grain boundaries in the films by conducting annealing after film formation, although some effect is achieved by the annealing. Accordingly, performing annealing after film formation is not sufficient as a countermeasure for decreasing the leakage current between electrode films.

The present invention has been made to address such challenges and makes it possible to enhance the reliability of thin film piezoelectric elements by decreasing the leakage current between the electrode films without impairing the piezoelectric properties of KNN thin films, which are piezoelectric thin films.

A thin film piezoelectric element according to the present invention includes a potassium sodium niobate thin film (KNN thin film) having a structure in which a plurality of crystal grains are present in the film thickness direction; and a pair of electrode films that sandwich the potassium sodium niobate thin film, in which when the potassium sodium niobate thin film is divided into three regions of the same thickness in the film thickness direction and the average crystal grain sizes $A_1$, $A_2$, and $A_3$ of the three regions are determined, the ratio m/M of the smallest average crystal grain size m among $A_1$, $A_2$, and $A_3$ to the largest average crystal grain size M among $A_1$, $A_2$, and $A_3$ is 10% to 80% and the region having the smallest average crystal grain size m lies next to one of the pair of the electrode films. With this structure, the leakage current between the electrode films can be reduced and a stable, high piezoelectric property −d31 can be achieved.

Here, the phrase "structure in which a plurality of crystal grains are present in the film thickness direction" means that, as shown in FIG. 3A, a piezoelectric thin film 203 has a structure in which there are a plurality of crystal grains stacked between upper and lower electrode films 202 and 204. The phrase "the region having the smallest average crystal grain size m lies next to one of the pair of electrode films" means that, as illustrated in FIG. 4, the region with the smallest average crystal grain size m is "a region 2031 or a region 2033". The potassium sodium niobate thin film is represented by a structural formula $(K,Na)NbO_3$, has a perovskite structure, and may contain Mn (manganese), Li (lithium), Sr (strontium), Ba (barium), Zr (zirconium), Ta (tantalum), etc., as additives.

The average crystal grain size according to the present invention will now be defined based on FIG. 4. In a thin film piezoelectric element 100, a laminate that includes the piezoelectric thin film 203 is cut in the thickness direction of the piezoelectric thin film (KNN thin film) 203 by machining or with a focused ion beam (referred to as FIB hereinafter) and the cross-section is observed with a scanning electron microscope (referred to as SEM hereinafter) or a TEM.

The observed image of the piezoelectric thin film 203 is divided into three regions 2031, 2032, and 2033 having the same thickness in the film thickness direction and the width of the crystal grains in a direction parallel to the electrode films is measured in each region. As shown in FIG. 4, the width W of the measurement region in which the crystal grain width is measured is equal to the thickness T of the piezoelectric thin film. The position at which the width of each crystal grain is measured is the central portion in the film thickness direction in each region. The average of the widths of the crystal grains is assumed to be the average crystal grain size of that region. Crystals having a width of 10 nm or less at the measurement point are not measured in the present invention.

Preferably, in the potassium sodium niobate thin film (KNN thin film) of the thin film piezoelectric element according to the present invention, the region having the largest average crystal grain size M does not lie next to either one of the pair of electrode films. In other words, the region with the largest average crystal grain size M is the region having an average crystal grain size $A_2$. With this structure, the leakage current between the electrode films can be further decreased and a higher stable piezoelectric property −d31 can be obtained.

In the three regions of the potassium sodium niobate thin film (KNN thin film) in the thin film piezoelectric element according to the present invention, the smallest average crystal grain size m is preferably 60 nm or more and 90 nm or less and the largest average crystal grain size M is preferably 100 nm or more. When a region having an average crystal grain size of 60 nm or more and 90 nm or less lies next to the electrode film, the leakage current between the electrode films can be decreased further. When a region having an average crystal grain size of 100 nm or more is present at the same time, a higher piezoelectric property −d31 can be achieved.

The potassium sodium niobate thin film (KNN thin film) of the thin film piezoelectric element according to the present invention preferably contains Mn. Incorporation of Mn further decreases the leakage current and a higher piezoelectric property −d31 can be achieved.

The potassium sodium niobate thin film (KNN thin film) of the thin film piezoelectric element according to the present invention preferably contains three or more elements selected from Li, Sr, Ba, Zr, and Ta. Incorporation of these elements further decreases the leakage current and a higher piezoelectric property −d31 can be achieved.

With the thin film piezoelectric element according to the present invention, the leakage current can be decreased and the piezoelectric properties can be improved compared to conventional thin film piezoelectric elements that use KNN thin films. The leakage current can be decreased and the piezoelectric properties can be improved also with a thin film piezoelectric actuator and a thin film piezoelectric sensor according to the present invention. Thus, high-performance hard disk drives and ink jet printers can be provided.

A thin film piezoelectric actuator according to the present invention includes the thin film piezoelectric element having the aforementioned structure and the thin film piezoelectric element includes a KNN thin film in which a plurality of potassium sodium niobate crystal grains are present in the film thickness direction. Specific examples of the thin film piezoelectric actuator include head assemblies of hard disk drives and piezoelectric actuators of ink jet printer heads.

A thin film piezoelectric sensor according to the present invention includes the thin film piezoelectric element having the aforementioned structure and the thin film piezoelectric element includes a KNN thin film in which a plurality of potassium sodium niobate crystal grains are present in the film thickness direction. Specific examples of the thin film piezoelectric sensor include gyro sensors, pressure sensors, and pulse wave sensors.

A hard disk drive and an ink jet printer according to the present invention each include the thin film piezoelectric actuator described above.

DESCRIPTION OF PREFERRED EMBODIMENTS

Preferred embodiments of the present invention will now be described in detail with reference to drawings.

(Thin Film Piezoelectric Element)

Figure 1:
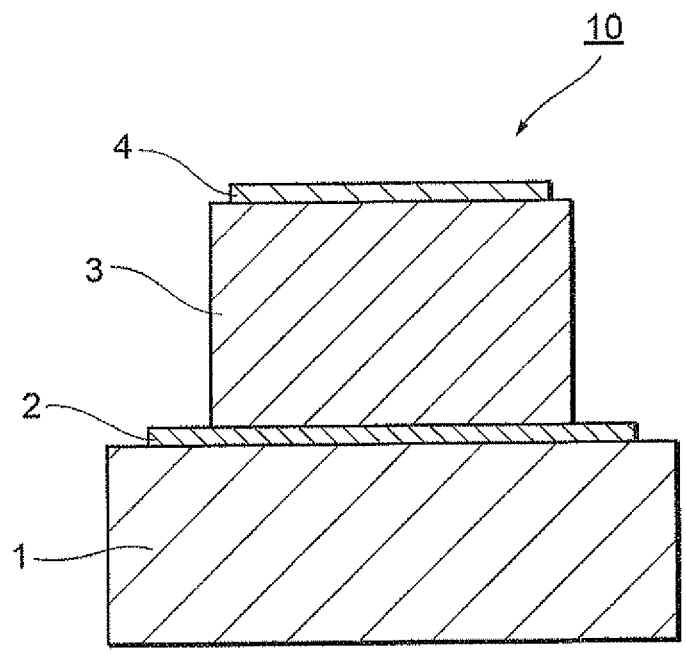
FIG. 1 is a diagram of a thin film piezoelectric element according to the present invention.

A structure of a thin film piezoelectric element 10 according to an embodiment is shown in FIG. 1.

A substrate 1 may be single crystal silicon, a silicon-on-insulator (SOI) substrate, a quartz glass substrate, a compound semiconductor substrate composed of GaAs or the like, a sapphire substrate, a metal substrate composed of stainless steel or the like, a MgO substrate, or a $SrTiO_3$ substrate. In particular, from the viewpoints of cost and ease of handling during processes, single crystal silicon is preferable. The thickness of the substrate 1 is usually 10 to 1000 μm.

A lower electrode film 2 is formed on the substrate 1. The material is preferably Pt (platinum) or Rh (rhodium). The method for forming is a vapor deposition method or a sputtering method. The thickness of the film is preferably 50 to 1000 nm.

A piezoelectric thin film 3 (KNN thin film) is formed on the lower electrode film 2. The piezoelectric thin film 3 is formed such that there are a plurality of crystal grains in the thickness direction. The piezoelectric thin film 3 is formed such that when an observed image of a cross-section of the piezoelectric thin film 3 is equally divided into three regions in the film thickness direction and the average crystal grain size of each region is determined, the ratio m/M of the smallest average crystal grain size m to the largest average crystal grain size M is 10% to 80%.

An example of a technique for controlling the size of crystal grains is to change the temperature settings for the substrate 1 during formation of the piezoelectric thin film 3. The crystal grains in the piezoelectric thin film 3 tend to be smaller when the temperature of the substrate 1 is set low and tend to be larger when the temperature of the substrate 1 is set high. As the size of the crystal grains increases, the piezoelectric property −d31 of the piezoelectric thin film 3 increases. Accordingly, a piezoelectric thin film 3 in which the average crystal grain size varies in the thickness direction can be obtained by a single sputtering target by changing the temperature setting for the substrate 1 during formation of the piezoelectric thin film 3.

Alternatively, a technique of using a plurality of sputtering targets having different compositions during formation of the piezoelectric thin film 3 so as to stack crystal grains having different sizes in accordance with the respective compositions may also be employed.

This technique makes use of the tendency of the crystal grains of the piezoelectric thin film 3 to be at their largest size when no additives are used and to become smaller with the increasing amounts of additives, provided that the temperature of the substrate 1 is the same during formation of the piezoelectric thin film 3. Thus, a piezoelectric thin film 3 in which the average crystal grain size varies in the thickness direction can be obtained by using a plurality of sputtering targets having different additive contents during formation of the piezoelectric thin film 3.

The region having the smallest average crystal grain size m among the three regions is arranged to lie next to either the lower electrode film 2 or an upper electrode film 4 described below. With this arrangement, crystal grain boundaries of the crystal grains in that region become intricate, complex, and longer. Accordingly, the leakage current between the electrode films is decreased.

Figure 2A:
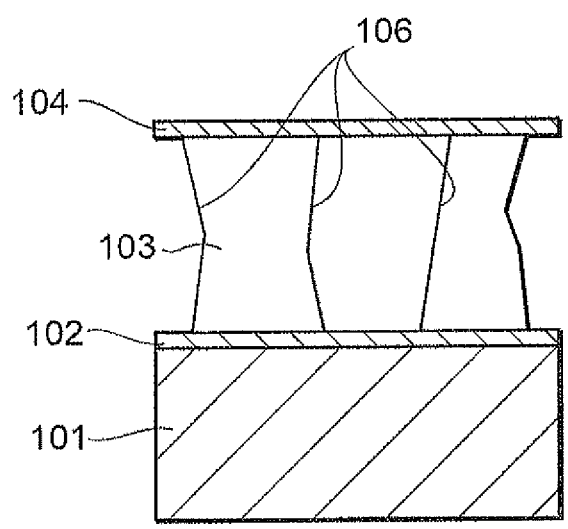
FIG. 2A is a schematic diagram of a cross-sectional structure of a thin film PIEZOELECTRIC element that has a highly crystalline piezoelectric thin film.
Figure 2B:
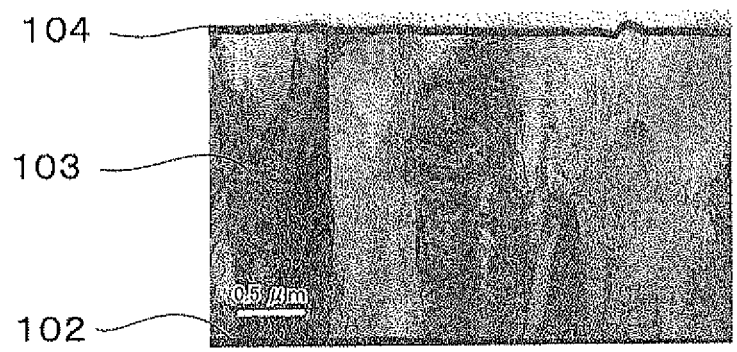
FIG. 2B is an example of a transmission electron microscope (TEM) image of a thin film piezoelectric element that has a highly crystalline piezoelectric thin film.
Figure 2C:
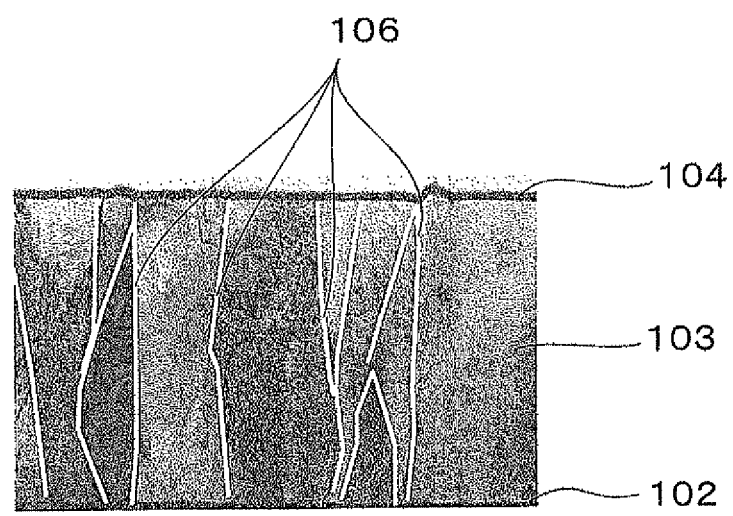
FIG. 2C is a diagram showing leakage current passages in the piezoelectric thin film shown in FIG. 2B.

The inventors have made the following presumption regarding the mechanism by which paths of a leakage current are formed. The main cause of formation of leak paths is the oxygen vacancies in the crystal grain boundaries in the piezoelectric thin film 3. The oxygen vacancies are not evenly distributed in all of the crystal grain boundaries but occur locally depending on the factors such as heat history, oxygen partial pressure during film formation, film thickness, and amounts of additives. The longer the total length of the crystal grain boundaries, the smaller the percentage of the portions with oxygen vacancies relative to the total length of the crystal grain boundaries and the fewer the leak paths. Assuming that the probability of one crystal grain turning into a leak path is A % and the number of crystal grains that are stacked in the film thickness direction is N, the risk that these crystal grains will become continuous with one another and form a leak path is $A^N$%. In contrast, when the crystallinity is high as shown in FIG. 2A, the number of crystal grains stacked between the electrode films is 1 and thus the risk of the crystal grain forming a leak path is A %. Since it is essential that $A > A^N$, stacking plural crystal grains in the film thickness direction has an effect of decreasing the leakage current between the electrode films.

However, as mentioned earlier, excessively reducing the average crystal grain size decreases the piezoelectric property −d31 of the piezoelectric thin film 3. Accordingly, the leakage current must be decreased while maintaining the piezoelectric properties required for the thin film piezoelectric element 10 by controlling the average crystal grain size to be within an appropriate range.

Thus, the region having the largest average crystal grain size M among the three regions is arranged so as not to lie next to any of the electrode films. In this manner, the piezoelectric property −d31 of the piezoelectric thin film 3 can be improved.

With the above-described structure, a piezoelectric thin film 3 in which the leakage current is decreased and a high piezoelectric property is achieved is obtained. The smallest average crystal grain size m among the regions of the piezoelectric thin film 3 is preferably 60 nm or more and 90 nm or less.

In the case where the smallest average crystal grain size m is less than 60 nm, the piezoelectric property −d31 tends to be lower than a practically sufficient value. In the case where the smallest average crystal grain size m is more than 90 nm, the leakage current between the electrode films tends to be higher than the practical upper limit for the thin film piezoelectric element 10.

The largest average crystal grain size M among the regions of the piezoelectric thin film 3 is preferably 100 nm or more. In this manner, a piezoelectric thin film 3 having a practically sufficient piezoelectric property −d31 is obtained. When the smallest average crystal grain size m is 60 nm or more and 90 nm or less, the upper limit of the largest average crystal grain size M is 900 nm.

Figure 3A:
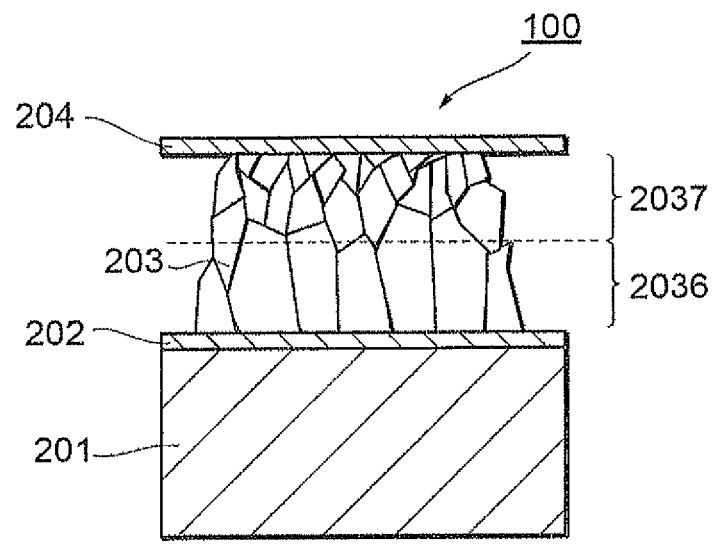
FIGS. 3A to 3C are schematic diagrams of a cross-sectional structure of a sodium potassium niobate thin film of a thin film piezoelectric element according to the present invention.
Figure 3B:
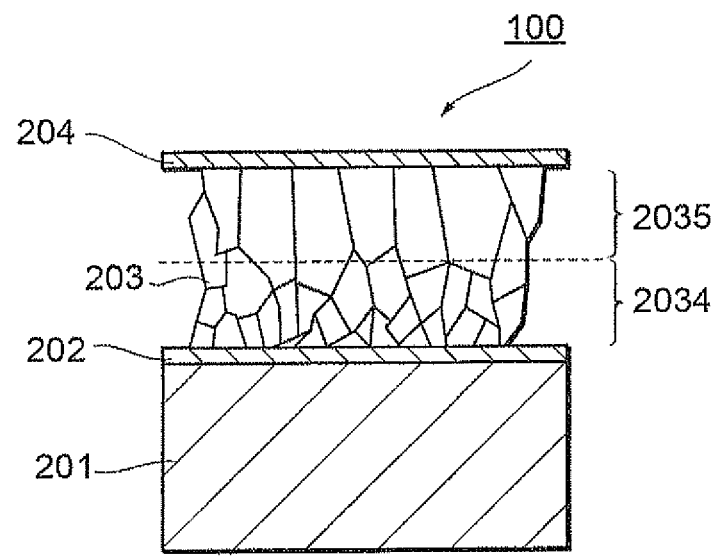

For example, as shown in FIG. 3B, a piezoelectric thin film 203 is formed by forming a region 2034 having good leakage current resistance and a small average crystal grain size to lie next to a lower electrode film 202 and stacking, on the region 2034, a region 2035 having a high piezoelectric property −d31 and a large average crystal grain size. As a result, the thin film piezoelectric element 100 as a whole exhibits low interelectrode leakage current and high piezoelectric property −d31.

In contrast, as shown in FIG. 3A, a piezoelectric thin film 203 may be formed by forming a region 2036 having a high piezoelectric property −d31 and a large average crystal grain size to lie next to the lower electrode film 202 and stacking, on the region 2036, a region 2037 having good leakage current resistance and small average crystal grain size. As a result, the thin film piezoelectric element 100 as a whole exhibits low interelectrode leakage current and high piezoelectric property −d31.

The piezoelectric thin film 3 preferably contains Mn (manganese). As a result, the leakage current in the thin film piezoelectric element 10 can be further decreased and a higher piezoelectric property −d31 can be obtained. The Mn content is within the range of 0.1 to 3.0 at %. At a Mn content of 3.0 at % or less, the decrease in piezoelectric property −d31 of the piezoelectric thin film 3 tends to be suppressed. At a Mn content of 0.1 at % or more, the effect of decreasing the leakage current between electrode films tends to be more easily achieved. The average crystal grain size of this piezoelectric thin film 3 tends to be smaller at the same substrate temperature compared to when the film is formed by using a sputtering target not containing any additives.

The piezoelectric thin film 3 more preferably contains three or more elements selected from Li (lithium), Sr (strontium), Ba (barium), Zr (zirconium), and Ta (tantalum). Incorporation of these elements further decreases the leakage current of the piezoelectric thin film 3 and makes it possible to obtain a higher piezoelectric property −d31. The ranges of the amounts of the respective elements added are Li: 0.1 to 3.0 at %, Sr: 0.5 to 6.0 at %, Ba: 0.05 to 0.3 at %, Zr: 0.5 to 6.0 at %, and Ta: 0.01 to 15 at %. The deterioration of the piezoelectric property −d31 tends to be prevented by setting the upper limits of the amounts of the respective elements added to the aforementioned values. The piezoelectric property −d31 tends to be improved by setting the lower limits of the amounts of the respective elements added to the aforementioned values. In addition to these elements, Mn may be added in the same range as described above.

Figure 3C:
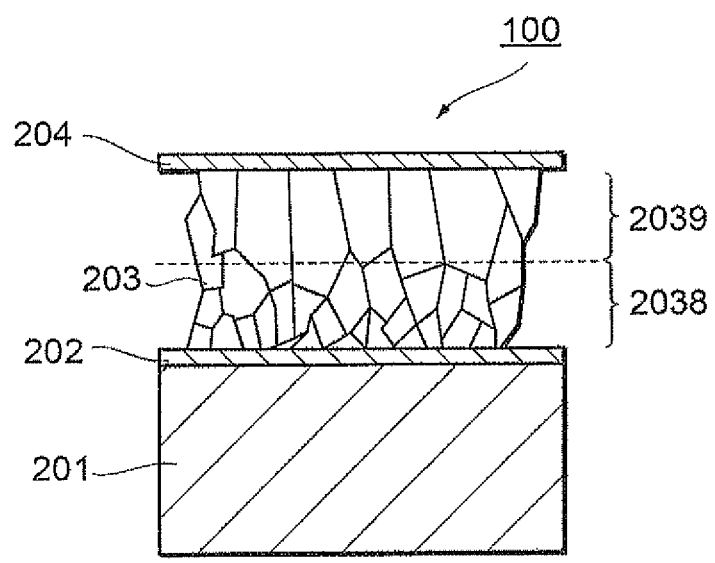

As shown in FIG. 3C, it is preferable to form a piezoelectric thin film 2038 containing additives next to the lower electrode film 202 and then form a piezoelectric thin film 2039 not containing any additives on the piezoelectric thin film 2038 by utilizing the tendency of the crystal grains to become smaller by addition of additives to the piezoelectric thin film 203. According to this structure, the leakage current of the piezoelectric thin film 203 can be further decreased and a higher piezoelectric property −d31 can be obtained.

The thickness of the piezoelectric thin film 3 is not particularly limited and may be, for example, about 0.5 to 10 μm.

Next, the upper electrode film 4 is formed on the piezoelectric thin film 3. The material is preferably Pt or Rh as with the lower electrode film 2. The thickness is preferably 50 to 1000 nm.

Next, the laminate that includes the piezoelectric thin film 3 is patterned through photolithography, dry etching, and wet etching and finally the substrate 1 is cut. As a result, a plurality of thin film piezoelectric elements 10 were obtained. Note that the substrate 1 may be removed from the thin film piezoelectric elements 10 to fabricate thin film piezoelectric elements constituted by laminates only. After the laminate is patterned, a protective film composed of polyimide or the like may be formed.

The methods for evaluating the thin film piezoelectric element 10 according to this embodiment are as follows.

(1) Calculation of Average Crystal Grain Size

Figure 4:
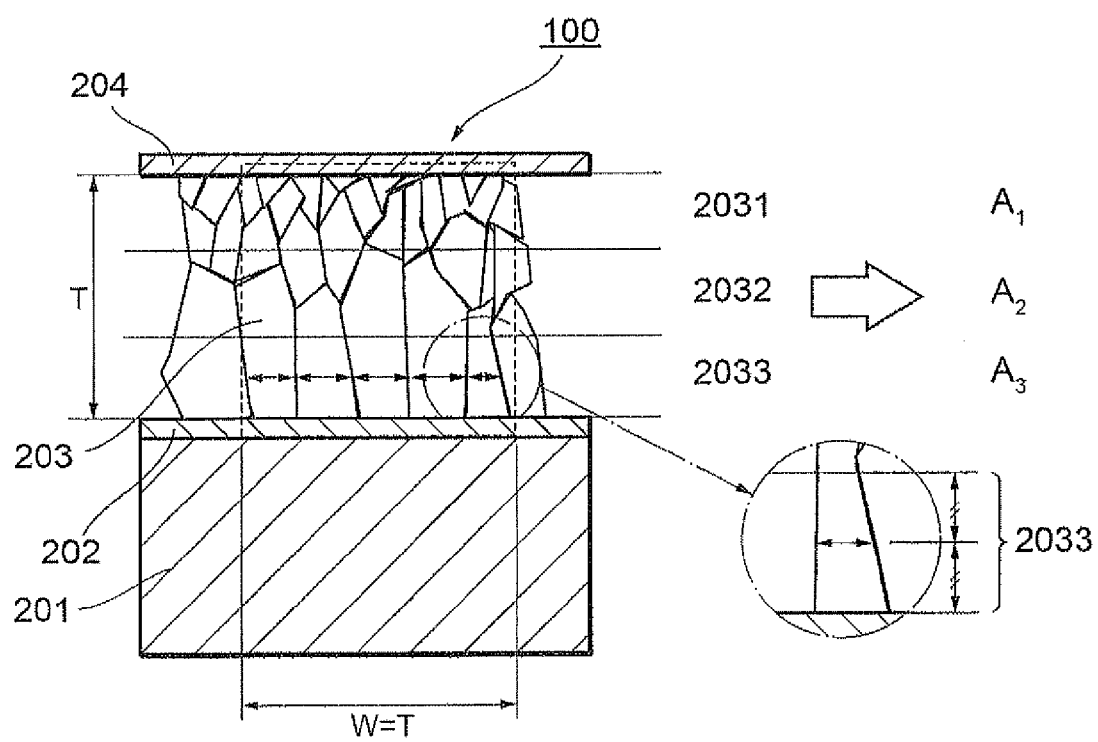
FIG. 4 is a diagram illustrating the definition of an average crystal grain size according to the present invention.

After formation of the piezoelectric thin film 3 or after formation of the upper electrode film 4, the piezoelectric thin film 3 is cut in a thickness direction of the piezoelectric thin film 3 by machining or with FIB and a section thereof is observed with SEM or TEM. When the thickness of the piezoelectric thin film 3 is T and the width of the observation region is W, W=T. The T×W region is observed. The observation region of the piezoelectric thin film 3 is divided into three regions of the same thickness in the film thickness direction, and the width of the crystal grains in a direction parallel to the electrode films is measured in each region. The width W of the observation region is equal to the thickness T of the piezoelectric thin film 3 and the position subject to the measurement is the central portion of each region in the film thickness direction. The average values are assumed to be the average crystal grain sizes of the respective regions (refer to FIG. 4).

(2) Measurement of Leakage Current Density Between Electrode Films

Measurement is conducted by applying a DC ±20 V between the upper and lower electrode films 2 and 4 of the thin film piezoelectric element 10 obtained by cutting the substrate 1 into a 5 mm×20 mm piece. A ferroelectric test system TF-1000 (produced by aixACCT) is used as the evaluation system. The voltage application time is 2 seconds.

(3) Measurement of Piezoelectric Property −d31

A voltage of 3 $V_{p-p}$ and a voltage of 20 $V_{p-p}$ are applied at 700 Hz between the upper and lower electrode films 2 and 4 of the thin film piezoelectric element 10 and the displacement at an end of the thin film piezoelectric element 10 is measured with a laser Doppler vibroscope and an oscilloscope. The piezoelectric property −d31 is obtained by calculation using the following expression (1):

$$d_{31} \cong -\frac{h_s^2}{3L^2}\frac{s_{11,p}}{s_{11,s}}\frac{\delta}{V} \qquad \text{Expression (1)}$$

where $h_s$: thickness of silicon substrate [400 μm], $S_{11,p}$: elastic compliance of piezoelectric thin film [1/104 GPa], $S_{11,s}$: elastic compliance of silicon substrate [1/168 GPa], L: length of drive unit [13.5 mm], δ: displacement, V: applied voltage. For the practical purposes, the thin film piezoelectric element 10 needs to have a leakage current density of $1\times10^{-5}$ A/cm$^2$ or less and a piezoelectric property of −d31 of 70 pm/V or more.

(Thin Film Piezoelectric Actuator)

Figure 5A:
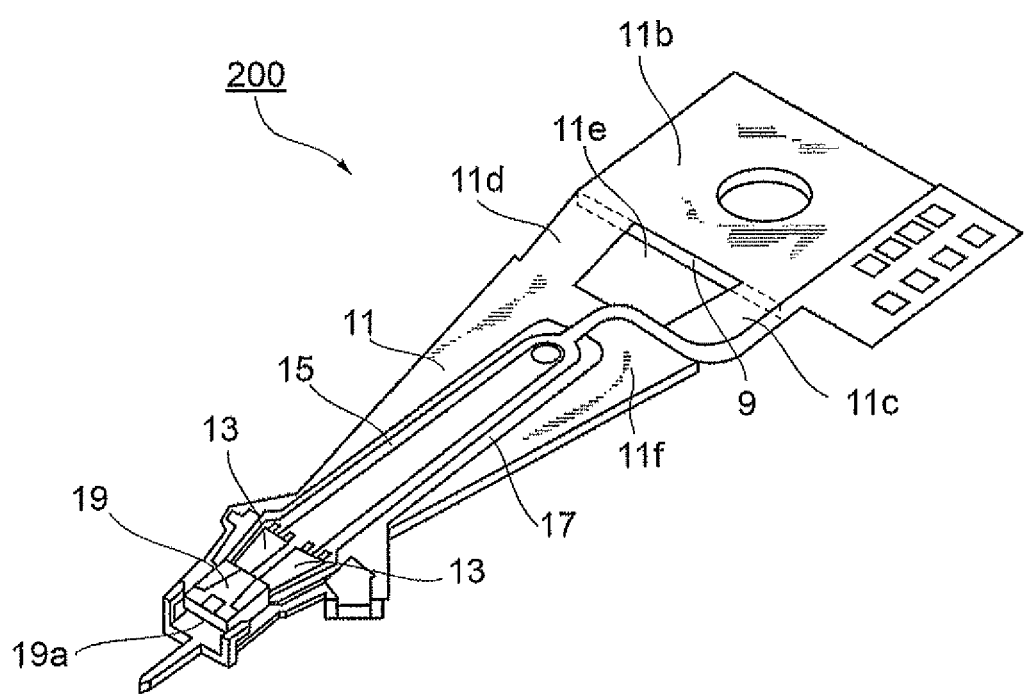
FIGS. 5A and 5B are diagrams of thin-film actuators according to the present invention.

FIG. 5A is a diagram showing a head assembly loaded in a hard disk drive (may be referred to as HDD hereinafter), which is an example of a thin film piezoelectric actuator that uses the thin film piezoelectric elements. As shown in the drawing, a head assembly 200 includes, as main constitutional elements, a base plate 9, a load beam 11, a flexure 17, and first and second thin film piezoelectric elements 13 serving as drive elements, and a slider 19 equipped with a head element 19a.

The load beam 11 includes a base anchor 11b fixed to the base plate 9 by, for example, beam welding, first and second flat springs 11c and 11d that are tapered and extend from the base anchor 11h, an opening lie formed between the first and second flat springs 11c and 11d, and a beam main portion 11f that is tapered and continuous with the first and second flat springs 11c and 11d and extends linearly.

The first and second thin film piezoelectric elements 13 are placed on a wiring flexible substrate 15 which is a part of the flexure 17, and are separated from each other with a particular gap therebetween. The slider 19 is fixed to the tip of the flexure 17 and rotates with expansion and contraction of the first and second thin film piezoelectric elements 13.

The first and second thin film piezoelectric elements 13 each include a first electrode film, a second electrode film, and a piezoelectric thin film sandwiched between the first and second electrode films. High withstand voltage and sufficient displacement can be obtained by using, as the piezoelectric thin film, a piezoelectric thin film that has a large displacement and generates less leakage current in a thin film piezoelectric element according to the present invention.

Figure 5B:
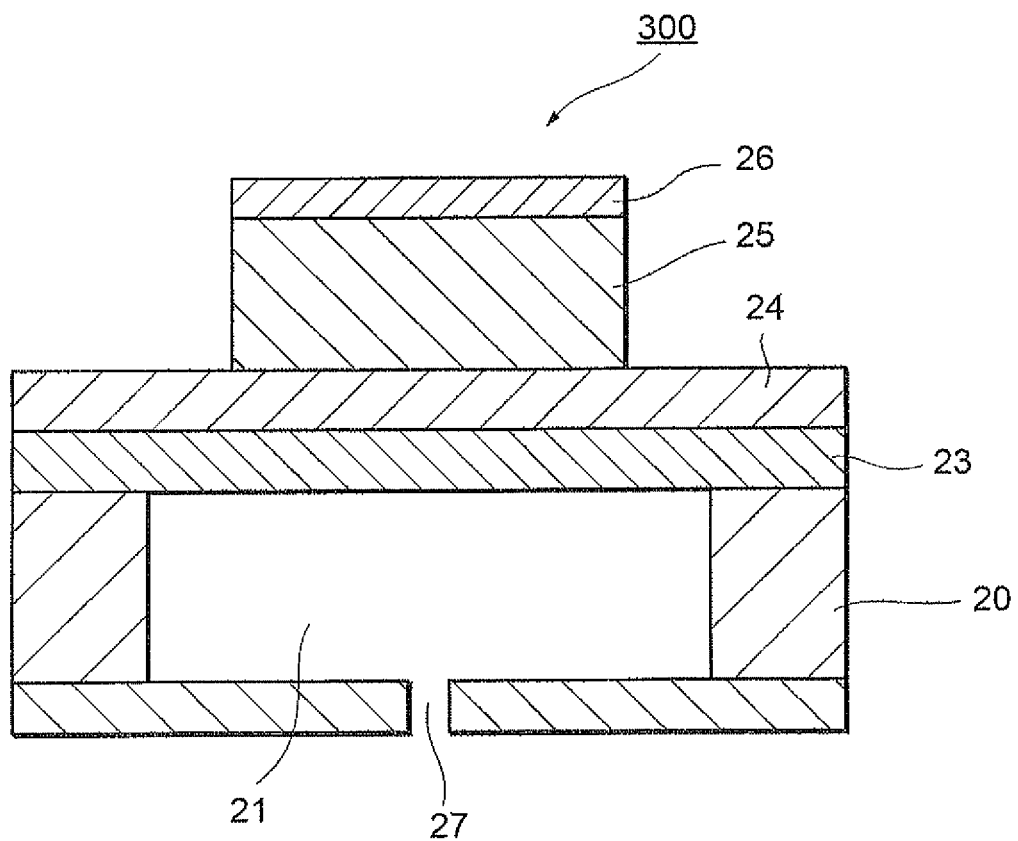

FIG. 5B is a diagram of a thin film piezoelectric actuator of an ink jet printer head which is another example of a thin film piezoelectric actuator that uses the thin film piezoelectric element.

A thin film piezoelectric actuator 300 is formed by stacking an insulating film 23, a lower electrode film 24, a piezoelectric thin film 25, and an upper electrode film 26 on a substrate 20.

If a predetermined ejection signal is not supplied and no voltage is applied between the lower electrode film 24 and the upper electrode film 26, the piezoelectric thin film 25 remains undeformed. A pressure chamber 21 with a thin film piezoelectric element to which a ejection signal is not supplied does not undergo a pressure change and thus ink droplets are not ejected from a nozzle 27.

In contrast, if a predetermined ejection signal is supplied and a particular voltage is applied between the lower electrode film 24 and the upper electrode film 26, the piezoelectric thin film 25 undergoes deformation. An insulating film 23 of a pressure chamber 21 with a thin film piezoelectric element to which a ejection signal is supplied undergoes large deflection. This momentarily increases the pressure inside the pressure chamber 21 and ink droplets are ejected from the nozzle 27.

High withstand voltage and sufficient displacement can be obtained by using, as the piezoelectric thin film, a piezoelectric thin film that has a large displacement and generates less leakage current in a thin film piezoelectric element according to the present invention.

(Thin Film Piezoelectric Sensor)

Figure 6A:
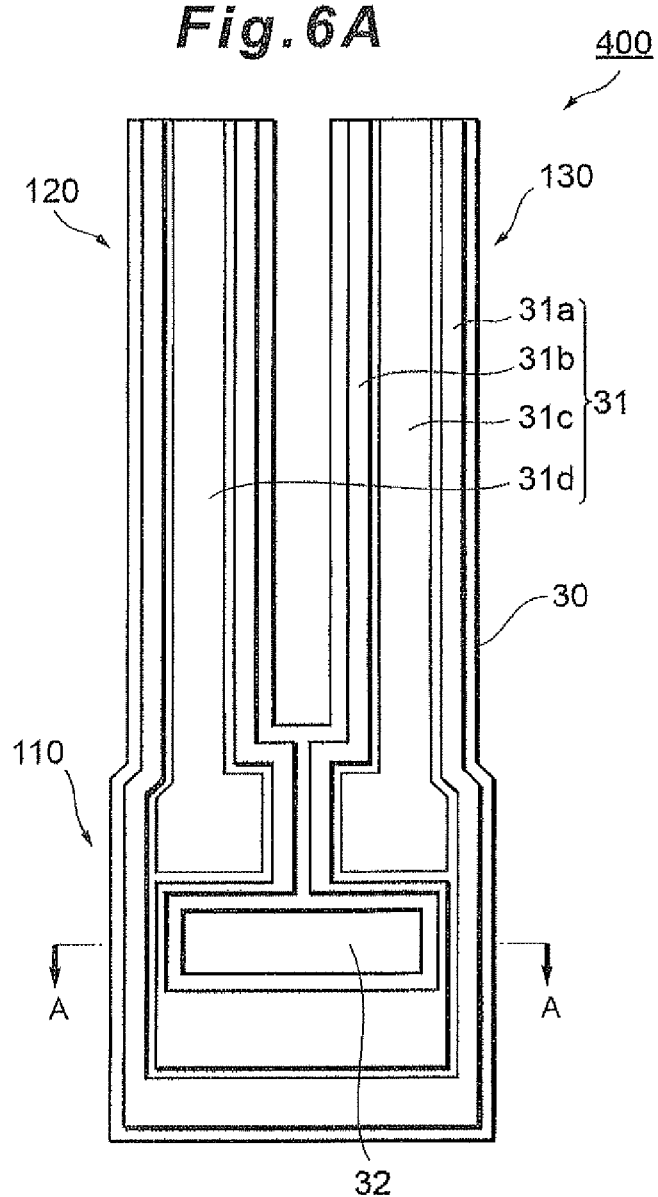
FIGS. 6A to 6D are diagrams of thin film piezoelectric sensors according to the present invention.
Figure 6B:
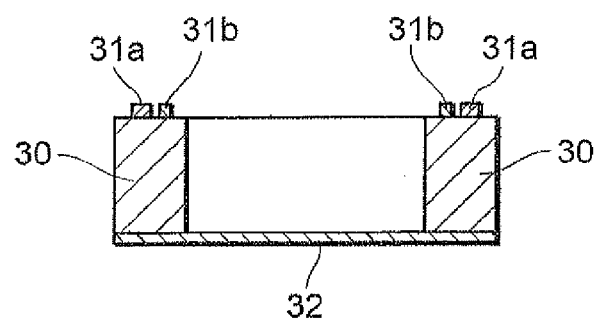

FIG. 6A is a diagram (plan view) of a gyro sensor which is one example of a thin film piezoelectric sensor that uses the thin film piezoelectric element described above. FIG. 6B is a cross-sectional view taken along line A-A in FIG. 6A.

A gyro sensor 400 is a tuning fork vibrator-type angular velocity detecting element equipped with a base 110, and two arms 120 and 130 connected to a surface of the base 110. The gyro sensor 400 is obtained by fine-processing the piezoelectric thin film 30, the upper electrode film 31, and the lower electrode film 32 that constitute the thin film piezoelectric element described above into a shape of a tuning fork vibrator. All the parts (base 110 and arms 120 and 130) are integrally formed by using a thin film piezoelectric element.

Driving electrode films 31a and 31b and a detection electrode film 31d are formed on a first main surface of the arm 120. Similarly, the driving electrode films 31a and 31b and a detection electrode film 31c are formed on a first main surface of the other arm 130. The electrode films 31a, 31b, 31c, and 31d are obtained by etching the upper electrode film 31 into particular electrode shapes.

The lower electrode film 32 formed on a second main surface (main surface at the back of the first main surface) of each of the base 110 and the arms 120 and 130 is in a solid form and functions as a ground electrode of the gyro sensor 400.

The longitudinal direction of each of the arms 120 and 130 is assumed to be the Z direction, a plane that includes the main surfaces of the two arms 120 and 130 is assumed to be an XZ plane, and an XYZ rectangular coordinate system is defined therefrom.

When a drive signal is supplied to the driving electrode films 31a and 31b, the two arms 120 and 130 are excited in an in-plane vibration mode. The in-plane vibration mode refers to a vibration mode in which the two arms 120 and 130 are excited in a direction parallel to the main surfaces of the two arms 120 and 130. For example, when the arm 120 is excited in the −X direction at a velocity V1, the other arm 130 is excited in the +X direction at a velocity V2.

When a rotation at an angular velocity m about the rotational axis Z acts on the gyro sensor 400 in such a state, the Coriolis force acts on each of the two arms 120 and 130 in a direction orthogonal to the velocity direction and excitation in an out-of-plane vibration mode begins. The out-of-plane vibration mode refers to a vibration mode in which the two arms 120 and 130 are excited in a direction orthogonal to the main surfaces of the two arms 120 and 130. For example, if the Coriolis force F1 acts on the arm 120 in the −Y direction, the Coriolis force F2 acts on the other arm 130 in the +Y direction.

Since the magnitudes of the Coriolis forces F1 and F2 are proportional to the angular velocity ω, the mechanical strains of the arms 120 and 130 caused by the Coriolis forces F1 and F2 are converted into electrical signals (detection signals) by using the piezoelectric thin film 30 and the angular velocity co can be determined from the signals retrieved from the detection electrode films 31c and 31d.

High withstand voltage and sufficient detection sensitivity can be obtained by using, as the piezoelectric thin film, a piezoelectric thin film that has a large displacement and generates less leakage current in a thin film piezoelectric element according to the present invention.

Figure 6C:
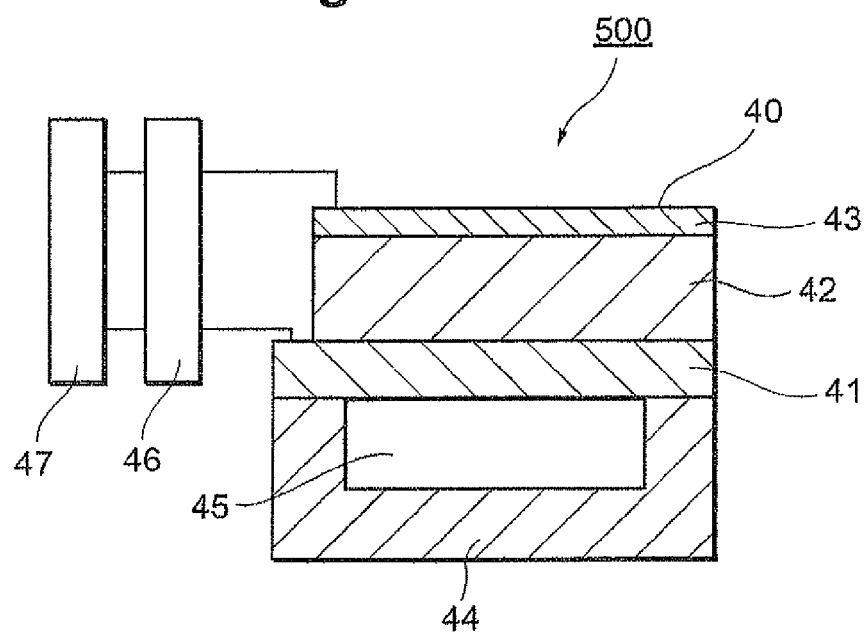

FIG. 6C is a diagram of a pressure sensor which is a second example of a thin film piezoelectric sensor that uses the thin film piezoelectric element described above.

A pressure sensor 500 has a cavity 45 that receives A pressure, a support 44 that supports a thin film piezoelectric element 40, a current amplifier 46, and a voltage meter 47. The thin film piezoelectric element 40 includes a common electrode film 41, a piezoelectric thin film 42, and an individual electrode film 43 which are stacked in that order on the support 44. The thin film piezoelectric element 40 deflects under application of external force and voltage is detected with the voltage meter 47.

High withstand voltage and sufficient detection sensitivity can be obtained by using, as the piezoelectric thin film, a piezoelectric thin film that has a large displacement and generates less leakage current in a thin film piezoelectric element according to the present invention.

Figure 6D:
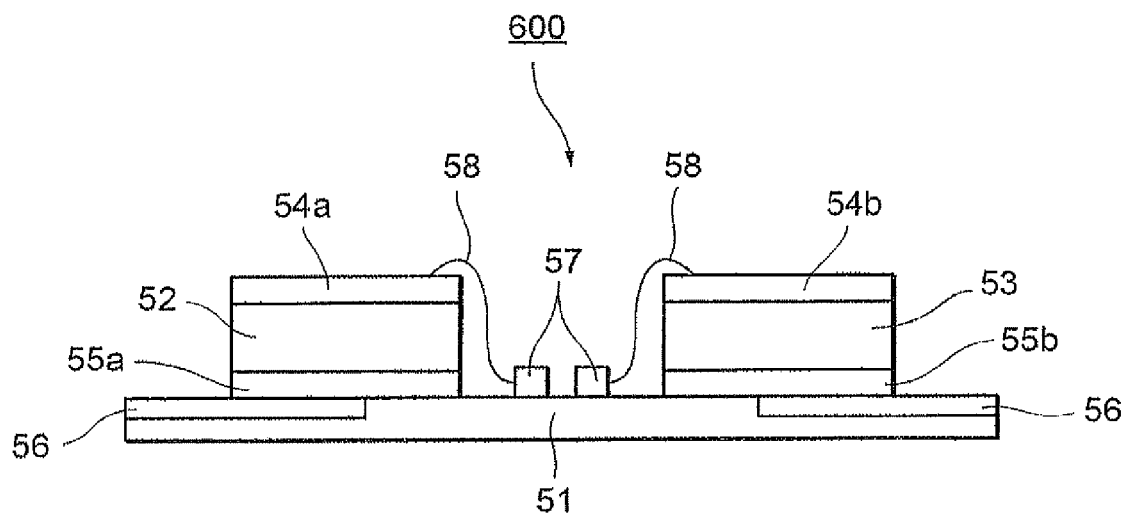

FIG. 6D is a diagram of a pulse wave sensor which is a third example of a thin film piezoelectric sensor that uses the thin film piezoelectric element described above.

A pulse wave sensor 600 has a structure in which a transmission thin film piezoelectric element and a reception thin film piezoelectric element are mounted on a substrate 51. In a transmission thin film piezoelectric element, electrode films 54a and 55a are formed on two surfaces of a transmission piezoelectric thin film 52 in the thickness direction. In the reception thin film piezoelectric element, electrode films 54b and 55b are formed on two surfaces of a reception piezoelectric thin film 53 in the thickness direction. Electrodes 56 and upper surface electrodes 57 are formed on the substrate 51 the electrode films 54a and 54b are respectively electrically connected to the upper surface electrodes 57 through wires 58.

In order to detect pulses of a living organism, the rear surface (surface to which the thin film piezoelectric elements are not mounted) of the substrate of the pulse wave sensor 600 is brought into contact with the living organism. On detecting the pulses, a particular drive voltage signal is output to the electrode films 54a and 55a of the transmission thin film piezoelectric element. The transmission thin film piezoelectric element vibrates in response to the drive voltage signal input to the electrode films 54a and 55a and generates ultrasonic waves which are transmitted to inside the living organism. The ultrasonic waves transmitted inside the living organism are reflected by the blood stream and received by the reception thin film piezoelectric element. The reception thin film piezoelectric element converts the received ultrasonic waves into voltage signals and outputs the voltage signals from the electrode films 54b and 55b.

High withstand voltage and sufficient detection sensitivity can be obtained by using, as the two piezoelectric thin films, piezoelectric thin films that have large displacement and generate less leakage current in a thin film piezoelectric element according to the present invention.

(Hard Disk Drive)

Figure 7:
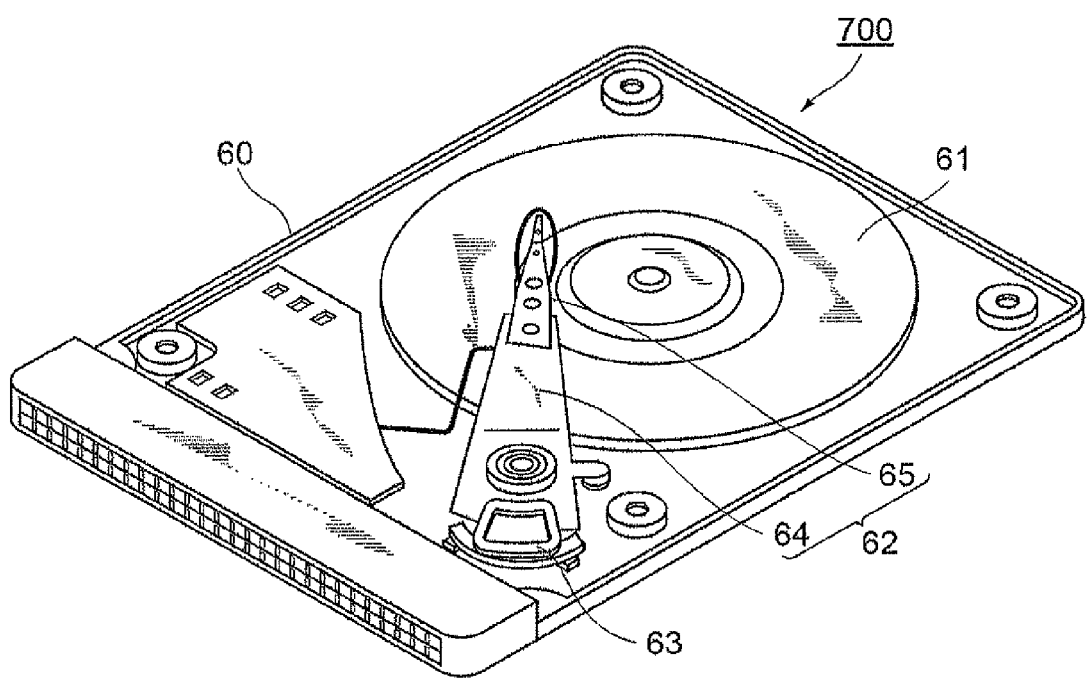
FIG. 7 is a diagram showing a hard disk drive according to the present invention.

FIG. 7 is a diagram of a hard disk drive equipped with the head assembly shown in FIG. 5A.

A hard disk drive 700 includes, in a housing 60, a hard disk 61, which is a recording medium, and a head stack assembly 62 for recording magnetic data on and regenerating the magnetic data from the hard disk. The hard disk 61 is rotated by a motor not shown in the drawing.

The head stack assembly 62 is obtained by stacking a plurality of assemblies in a direction away from the plane of the paper of the drawing, the assemblies each including an actuator arm 64 rotatably supported about a shaft by a voice coil motor 63, and a head assembly 65 connected to the actuator arm 64. At a tip of the head assembly 65, a head slider 19 is attached so as to face the hard disk 61 (see FIG. 5A).

The head assembly 65 employs a system that moves the head element 19a (see FIG. 5A) in two steps. Relatively large moves of the head element 19a are controlled by generally driving the actuator arm 64 and the head assembly 65 by using the voice coil motor 63. Fine moves are controlled by driving the head slider 19 by the tip of the head assembly 65.

High withstand voltage and sufficient accessibility can be obtained by using, in the thin film piezoelectric element used in the head assembly 65, a piezoelectric thin film that has a large displacement and generates less leakage current in a thin film piezoelectric element according to the present invention.

(Ink Jet Printer)

Figure 8:
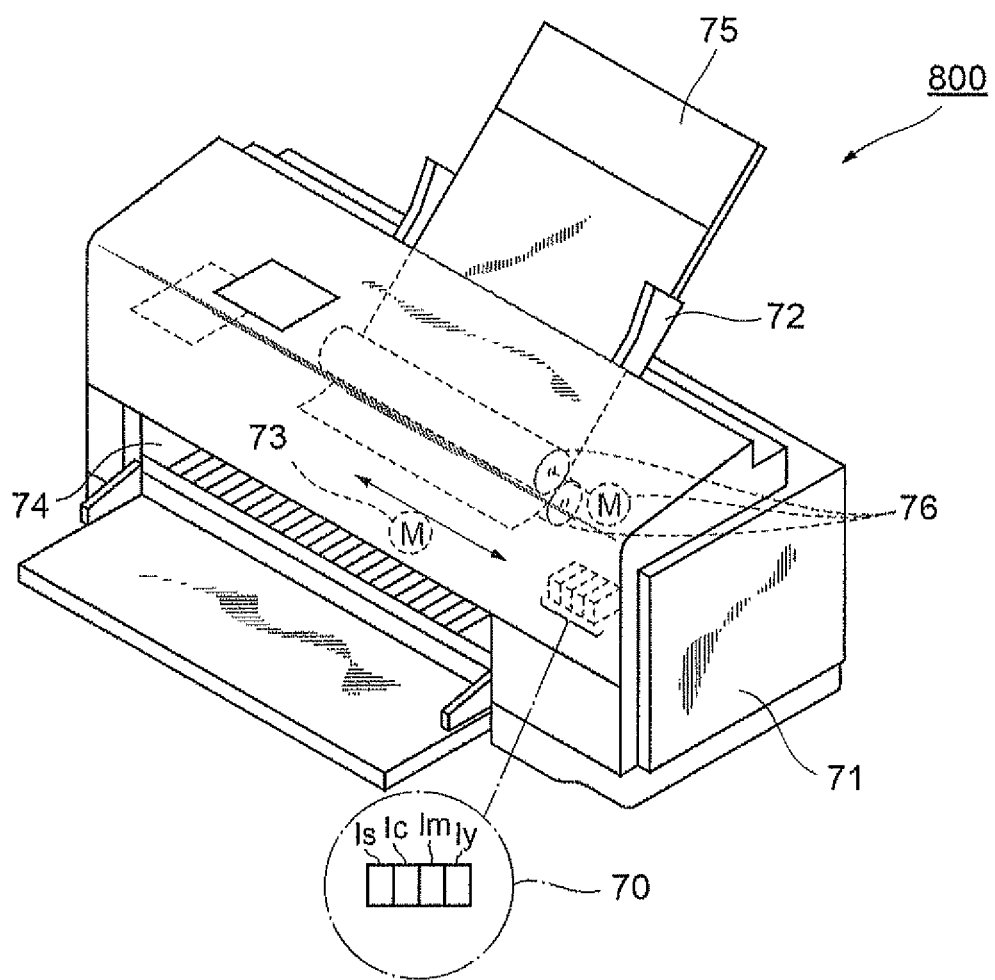
FIG. 8 is a diagram showing an ink jet printer according to the present invention.

FIG. 8 is a diagram of an ink jet printer that includes the ink jet printer head shown in FIG. 5B.

An ink jet printer 800 mainly includes an ink jet printer head 70, a main unit 71, a tray 72, and a head driving mechanism 73.

The ink jet printer 800 is equipped with ink cartridges of a total of four colors, namely, yellow, magenta, cyan, and black and configured to perform full-color printing. The ink jet printer 800 includes a special controller board and the like inside so as to control the ink ejection timing of the ink jet printer head 70 and scanning of the head driving mechanism 73. The tray 72 is provided on the back of the main unit 71, and an automatic sheet feeder (automatic continuous sheet-feeding mechanism) 76 is provided inside the main unit 71. A recording paper sheet 75 is automatically fed and discharged from an ejection slot 74 at the front.

An ink jet printer having high withstand voltage and high safety can be provided when a piezoelectric thin film that has a large displacement and generates less leakage current in a thin film piezoelectric element according to the present invention is used in the thin film piezoelectric element used in the thin film piezoelectric actuator of the ink jet printer head 70.

EXAMPLES

The present invention will now be described in more specific detail based on Examples and Comparative Examples below. Note that the scope of the present invention is not limited to these examples.

Example 1

First, a lower electrode film 2 which serves as a base film of a piezoelectric thin film 3 was formed on a single crystal silicon substrate 1 by crystal growth. This lower electrode film 2 was a Pt film and had a thickness of 200 nm. The method for forming was a sputtering method and the film was formed while setting the temperature of the substrate 1 to 500° C.

Next, a first layer of a piezoelectric thin film was formed by using a $(K,Na)NbO_3$ sputtering target not containing any additives. The method for forming was a sputtering method and the film was formed while setting the temperature of the substrate 1 to 580° C. The thickness of the piezoelectric thin film under this condition was 0.7 μm. It is known that, in the case where the piezoelectric thin film 3 is a KNN thin film, crystals show the highest c-axis orientation when the temperature of the substrate 1 is set to 550° C.

Next, a second layer of the piezoelectric thin film was formed while setting the temperature of the substrate 1 to 560° C. The thickness of the piezoelectric thin film under this condition was 0.7 μm. Then a third layer of the piezoelectric thin film was formed while setting the temperature of the substrate 1 to 540° C. The thickness of the piezoelectric thin film under this condition was 0.7 μm. As a result, a piezoelectric thin film 3 having a total thickness of 2.1 μm was obtained.

Next, a Pt film was formed as an upper electrode film 4. As with the lower electrode film 2, the method for forming was a sputtering method but the substrate temperature was set to 200° C. The thickness was 200 nm.

Next, a laminate that includes the piezoelectric thin film 3 was patterned by photolithography, dry etching, and wet etching, and the substrate was cut into 5 mm×20 mm pieces to obtain a number of thin film piezoelectric elements 10.

In order to evaluate the average crystal grain size of the piezoelectric thin film 3, a apart of the thin film piezoelectric element 10 was cut in a film thickness direction with a FIB and the cross-section was observed with a TEM. The height and width of the observation region were each 2.1 μm, which was equal to the thickness of the piezoelectric thin film 3.

Figure 9A:
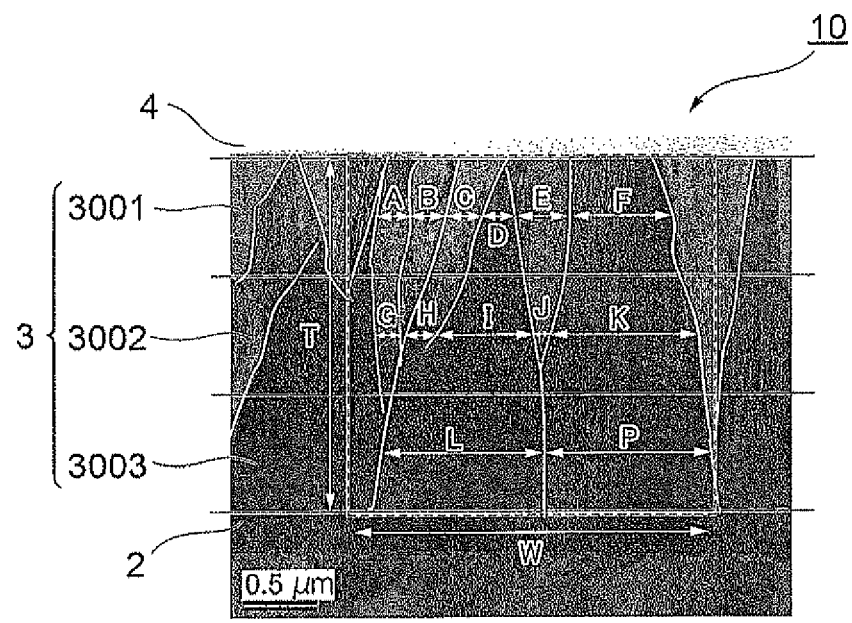
FIG. 9A shows a transmission electron microscope (TEM) image of a cross-sectional structure of a potassium sodium niobate thin film of a thin film piezoelectric element according to the present invention, in which the average crystal grain sizes of the three regions obtained by equally dividing the image in a film thickness direction are shown.

FIG. 9A illustrates a method for evaluating the average crystal grain size of the piezoelectric thin film 3 of Example 1. A TEM image of the piezoelectric thin film 3 was divided into three regions 3001, 3002, and 3003 of the same thickness in the film thickness direction and the average crystal grain size of each region was measured in accordance with the definitions shown in FIG. 4. In FIG. 9A, in the region 3001 next to the upper electrode film 4, there were six crystal grains A to F that were completely within the width W of the observation region and the crystal grain sizes of these were observed to be 225 nm, 225 nm, 261 nm, 239 nm, 405 nm, and 658 nm, respectively. The average crystal grain size of the region 3001 determined as the average of these values was 336 nm. Similarly, in the region 3002, the observed sizes of five crystal grains G to K were 189 nm, 239 nm, 644 nm, 144 nm, and 941 nm, and the average crystal grain size was 432 nm. In the region 3003, the observed sizes of two crystal grains L and P were 1108 nm and 1131 nm, and the average crystal grain size was 1119 nm. Accordingly, the average crystal grain sizes of the three regions of the piezoelectric thin film 3 were, in order from the lower electrode film 2 side, 1119 nm, 432 nm, and 336 nm. The ratio of the smallest average crystal grain size m to the largest average crystal grain size M is 30% and the region with the smallest average crystal grain size m lies next to the interface with the upper electrode film 4.

Next, the leakage current density between the electrode films in another thin film piezoelectric element 10 of Example 1 was measured. Measurement was conducted by applying DC ±20 V between the upper and lower electrode films 2 and 4. A ferroelectric test system TF-1000 (produced by aix-ACCT) was used as the evaluation system. The voltage application time was 2 seconds. The leakage current density was $9.9 \times 10^{-6}$ A/cm$^2$.

Another thin film piezoelectric element 10 was used to evaluate the piezoelectric property −d31. A voltage of 700 Hz, 20 $V_{p-p}$ was applied between the upper and lower electrode films 2 and 4 of the thin film piezoelectric element 10 and the displacement at an end of the thin film piezoelectric element 10 was measured with a laser Doppler vibroscope and an oscilloscope.

The piezoelectric property −d31 was obtained by calculation using the following expression (1):

$$d_{31} \cong -\frac{h_s^2}{3L^2} \frac{s_{11,p}}{s_{11,s}} \frac{\delta}{V} \qquad \text{Expression (1)}$$

where $h_s$: thickness of silicon substrate [400 μm], $S_{11,p}$: elastic compliance of piezoelectric thin film [1/104 GPa], $S_{11,s}$: elastic compliance of silicon substrate [1/168 GPa], L: length of drive unit [13.5 mm], δ: displacement, V: applied voltage.

The piezoelectric property −d31 was found to be 115 (pm/V).

The properties of the thin film piezoelectric element 10 satisfy a leakage current density of $1 \times 10^{-5}$ A/cm$^2$ or less and a piezoelectric property of −d31 of 70 pm/V or more required for practical applications.

The substrate temperature setting during formation of the piezoelectric thin film 3, the average crystal grain size in each of the three regions of the piezoelectric thin film 3 equally divided in the film thickness direction, the ratio of the smallest average crystal grain size to the largest average crystal grain size, the leakage current density, and the piezoelectric property −d31 in Example 1 are shown in Table 1.

Comparative Example 1

A thin film piezoelectric element 90 of Comparative Example 1 was prepared as in Example 1 except that the substrate temperature setting was changed to that shown in Table 1, and the properties of the element were also evaluated.

Figure 9B:
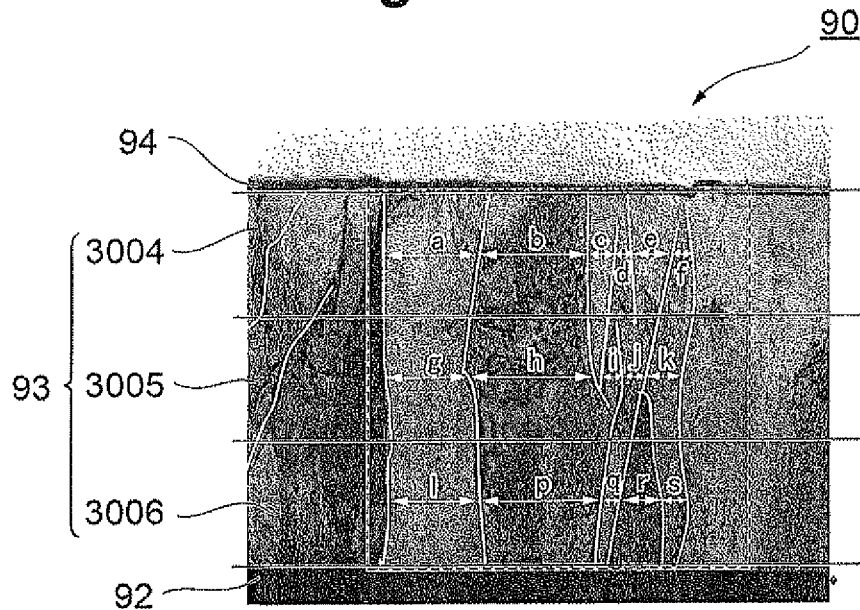
FIG. 9B shows a transmission electron microscope (TEM) image of a cross-sectional structure of a potassium sodium niobate thin film of a thin film piezoelectric element according to related art, in which the average crystal grain sizes of the three regions obtained by equally dividing the image in a film thickness direction are shown.

A TEM cross-sectional image of the thin film piezoelectric element 90 of Comparative Example 1 is shown in FIG. 9B.

The TEM cross-sectional image of a piezoelectric thin film 93 was divided into three regions of the same thicknesses in the film thickness direction and the average crystal grain size of each region was measured in accordance with the definitions. In a region 3004 next to the upper electrode film 94, there were six crystal grains a to f that were completely within the width W of the observation region and the crystal grain sizes of these were observed to be 636 nm, 709 nm, 218 nm, 132 nm, 264 nm, and 182 nm, respectively. The average crystal grain size of the region 3004 determined as the average of these values was 357 nm. Similarly, in a region 3005, the observed sizes of five crystal grains g to k were 600 nm, 841 nm, 168 nm, 168 nm, and 255 nm, and the average crystal grain size thereof was 406 nm. In a region 3006, the observed sizes of five crystal grains l to s were 614 nm, 832 nm, 118 nm, 291 nm, and 218 nm, and the average crystal grain size thereof was 415 nm. Accordingly, the average crystal grain sizes of the three regions of the piezoelectric thin film 3 were, in order from the lower electrode film 92 side, 415 nm, 406 nm, and 357 nm. The ratio of the smallest average crystal grain size m to the largest average crystal grain size M is 86% and the region having the smallest average crystal grain size m lies next to the interface with the upper electrode film 94.

Next, the leakage current density between the electrode films in another thin film piezoelectric element 90 of Comparative Example 1 was measured. The result was 5.0E-5 A/cm$^2$.

Another thin film piezoelectric element 90 was used to evaluate the piezoelectric property −d31. The result was 109 pm/V.

Although the thin film piezoelectric element 90 shows a high piezoelectric property, the leakage current density does not satisfy the practically required level of $1 \times 10^{-5}$ A/cm$^2$ or less. Thus, the element is not practically applicable.

Examples 2 to 8 and Comparative Examples 2 to 5

Thin film piezoelectric elements 10 and 90 were fabricated as in Example 1 except that the piezoelectric thin film 3 was prepared by two- or three-step substrate temperature settings shown in Table 1, and the evaluation of the properties was carried out as in Example 1. The preparation conditions and the evaluation results are shown in Table 1. In each of the first to third steps of the substrate temperature setting, a 0.7 μm piezoelectric thin film was formed.

Examples 9 and 10

A (K,Na)NbO$_3$ sputtering target to which 0.4 at % of Mn was added was used as a sputtering target for forming the piezoelectric thin film 3. The piezoelectric thin film 3 was formed while the substrate temperature was set as shown in Table 1. The rest of the conditions were the same as in Example 1 and the thin film piezoelectric element 10 was prepared and the properties were evaluated. The preparation conditions and the evaluation results are shown in Table 1.

Examples 11 and 12

A (K,Na)NbO$_3$ sputtering target to which 0.4 at % of Mn, 1.5 at % of Li, 3.0 at % of Sr, 0.1 at % of Ba, 3.0 at % of Zr, and 4 at % of Ta were added was used as a sputtering target for forming the piezoelectric thin film 3. The piezoelectric thin film 3 was formed while the substrate temperature was set as shown in Table 1. The rest of the conditions were the same as in Example 1 and the thin film piezoelectric element 10 was fabricated and the properties were evaluated. The preparation conditions and the evaluation results are shown in Table 1.

Examples 13 and 14

A (K,Na)NbO$_3$ sputtering target not containing any additives and a (K,Na)NbO$_3$ sputtering target to which 0.4 at % of Mn, 1.5 at % of Li, 0.1 at % of Ba, and 4 at % of Ta were added were used as sputtering targets for forming the piezoelectric thin film 3. The sputtering targets were switched in the order shown in Table 1 and the piezoelectric thin film 3 was formed at the substrate temperatures of the setting. The rest of the conditions were the same as in Example 1 and the thin film piezoelectric element 10 was fabricated and the properties were evaluated. The preparation conditions and the evaluation results are shown in Table 1.

As results of Comparative Examples 1 and 2 indicate, it is difficult to achieve both a leakage current density of $1 \times 10^{-5}$ A/cm$^2$ or less and a piezoelectric property –d31 of 70 pm/V or more which are practically required for thin film piezoelectric elements if the piezoelectric thin film 93 is formed under a single condition. In this case, the m/M ratio exceeds 80%.

As results of Comparative Example 3 indicate, even when the average crystal grain size of the piezoelectric thin film 93 is graded in the electrode film thickness direction, the leakage current density of the thin film piezoelectric element 90 is high if the piezoelectric thin films having large average crystal grain sizes are formed to lie next to the two electrode films.

As the results of Comparative Example 4 indicate, even when the average crystal grain size of the piezoelectric thin film 93 is graded in the electrode film thickness direction and piezoelectric thin films having relatively small average crystal grain sizes are formed to lie next to the two electrode films so as to decrease the leakage current density, the piezoelectric property –d31 of the thin film piezoelectric element 90 is degraded if the average crystal grain size of the center portion of the piezoelectric thin film 93 is smaller than the average crystal grain sizes of the portions next to the electrode films.

As results of Comparative Example 5 indicate, in the case where a piezoelectric thin film having an excessively small average crystal grain size is formed to lie next to one of the electrode films to decrease the leakage current density, the m/M ratio becomes less than 10% and the piezoelectric property –d31 of that region with the small average crystal grain size is significantly degraded. As a result, the piezoelectric property –d31 of the piezoelectric thin film 93 as a whole is decreased.

In contrast, in Examples 1 to 8, because piezoelectric thin film regions having the average crystal grain sizes shown in Table 1 are stacked, the target values were achieved in terms of both the leakage current density and the piezoelectric property –d31 of the thin film piezoelectric element 10.

However, in Examples 1 and 2, a region with the largest average crystal grain size was formed to lie next to the lower electrode film 2. Thus, the leakage current density of the piezoelectric thin film 3 was slightly high and the margin with respect to the target value, $1.0 \times 10^{-5}$ A/cm$^2$ or less, was narrow.

In Examples 3 to 6, the region with the largest average crystal grain size was formed at the central portion of the piezoelectric thin film 3 and thus the margin relative to the target leakage current density of the piezoelectric thin film 3, namely, $1.0 \times 10^{-5}$ A/cm$^2$ or less, widens compared to Examples 1 to 2.

However, in Examples 3, 5, and 6, the smallest average crystal grain size was small and in. Example 4, the largest average crystal grain size was small. Thus, the piezoelectric property –d31 of the piezoelectric thin film 3 as a whole had a narrow margin with respect to the target value, 70 pm/V or more.

Compared to these results, in Examples 7 and 8 in which the smallest average crystal grain size was 60 to 90 nm and the largest average crystal grain size was 100 nm or more, the thin film piezoelectric element 10 exhibited a higher piezoelectric property –d31 than in Examples 3 to 6 while maintaining stable leakage current density.

In Examples 9 and 10, a (K,Na)NbO$_3$ sputtering target to which 0.4 at % of Mn was added was used to form a piezoelectric thin film 3 that has the same structure and regions with average crystal grain sizes as in Examples 7 and 8. As described in Non Patent Literatures 1 and 2, it is known that addition of Mn decreases the leakage current in the potassium sodium niobate thin film (KNN thin film). According to the results of Examples, the leakage current density decreased further and a higher piezoelectric property –d31 was obtained compared to the thin film piezoelectric elements 10 of Examples 7 and 8 prepared by using sputtering targets not containing Mn.

In Examples 11 and 12, a (K,Na)NbO$_3$ sputtering target to which Mn, Li, Sr, Ba, Zr, and Ta were added was used to form a piezoelectric thin film 3 that has substantially the same structure and regions with average crystal grain sizes as in Examples 7 to 10. According to the evaluation results, the leakage current density of the thin film piezoelectric element 10 decreased further and a sufficiently high piezoelectric property –d31 was obtained compared to the thin film piezoelectric elements 10 of Examples 9 and 10 prepared by using a sputtering target in which only Mn is added to (K,Na)NbO$_3$.

In Examples 13 and 14, a piezoelectric thin film 3 was formed by using a plurality of sputtering targets having different compositions in the order described in the column of additives in Table 1. In this case also, a sufficiently low leakage current density and a sufficiently high piezoelectric property –d31 were achieved.

A thin film piezoelectric element according to the present invention includes a lower electrode film, an upper electrode film, and a piezoelectric thin film sandwiched between the lower and upper electrode films. High withstand voltage and sufficient displacement can be achieved when a piezoelectric layer that has large displacement and generates less leakage current is used as an piezoelectric thin film of a thin film piezoelectric actuator.

High withstand voltage and sufficient detection sensitivity can be obtained by using, as a piezoelectric thin film of a thin film piezoelectric sensor, a piezoelectric thin film according to the present invention that has large displacement and generates less leakage current.

High withstand voltage and sufficient accessibility can be obtained by using, as a piezoelectric thin film of a thin film piezoelectric element used in a head assembly of a hard disk drive, a piezoelectric thin film according to the present invention that has large displacement and generates less leakage current.

High withstand voltage and high safety can be obtained by using, as a piezoelectric thin film of a thin film piezoelectric element used in a thin film actuator of an ink jet printer head, a piezoelectric thin film according to the present invention that has large displacement and generates less leakage current.

TABLE 1

| | | | Substrate temperature setting (° C.) | | | Average crystal grain size in three divided regions (nm) | | | Largest and smallest average crystal grain size (nm) | | | Leakage current | −d31 |
|---|---|---|---|---|---|---|---|---|---|---|---|---|---|
| | | KNN film thickness | | | | | | | | | | density | (pm/V) |
| | Additive | (μm) | 1st | 2nd | 3rd | Area 1 | Area 2 | Area 3 | Smallest size m | Largest size M | m/M | (A/cm2) | $V_{p-p}$20 V |
| Example 1 | None | 2.1 | 580 | 580 | 540 | 1119 | 432 | 335 | 336 | 1119 | 30% | 9.90E−06 | 115 |
| Example 2 | None | 2.1 | 520 | 520 | 460 | 138 | 120 | 52 | 52 | 138 | 38% | 9.30E−06 | 81 |
| Example 3 | None | 2.1 | 440 | 510 | 490 | 42 | 121 | 105 | 42 | 121 | 35% | 4.80E−06 | 71 |
| Example 4 | None | 2.1 | 460 | 500 | 500 | 67 | 95 | 92 | 67 | 95 | 71% | 4.50E−06 | 73 |
| Example 5 | None | 2.1 | 460 | 510 | 500 | 50 | 132 | 112 | 50 | 132 | 38% | 4.50E−06 | 74 |
| Example 6 | None | 2.1 | 540 | 550 | 450 | 250 | 325 | 42 | 42 | 325 | 13% | 3.10E−06 | 78 |
| Example 7 | None | 2.1 | 460 | 510 | 510 | 62 | 156 | 143 | 62 | 156 | 40% | 4.80E−06 | 95 |
| Example 8 | None | 2.1 | 530 | 540 | 490 | 185 | 260 | 86 | 86 | 260 | 33% | 3.20E−06 | 113 |
| Example 9 | Mn | 2.1 | 480 | 540 | 540 | 65 | 180 | 168 | 65 | 180 | 36% | 1.20E−06 | 105 |
| Example 10 | Mn | 2.1 | 550 | 570 | 540 | 185 | 310 | 73 | 73 | 310 | 24% | 2.10E−06 | 118 |
| Example 11 | Mn, Li, Sr, Ba, Zr, Ta | 2.1 | 510 | 530 | 530 | 72 | 135 | 125 | 72 | 135 | 53% | 7.50E−07 | 102 |
| Example 12 | Mn, Li, Sr, Ba, Zr, Ta | 2.1 | 560 | 560 | 510 | 225 | 260 | 75 | 75 | 260 | 29% | 6.20E−07 | 115 |
| Example 13 | Plural targets: Mn ⇒ None ⇒ None | 2.1 | 480 | 520 | 520 | 65 | 130 | 141 | 65 | 141 | 46% | 3.50E−06 | 112 |
| Example 14 | Plural targets: Mn ⇒ None ⇒ Mn | 2.1 | 510 | 540 | 520 | 87 | 235 | 96 | 87 | 235 | 37% | 8.70E−07 | 106 |
| Comparative Example 1 | None | 2.1 | 560 | 580 | 560 | 415 | 406 | 357 | 357 | 415 | 86% | 5.00E−05 | 109 |
| Comparative Example 2 | None | 2.1 | 490 | 490 | 490 | 85 | 81 | 73 | 73 | 85 | 86% | 7.40E−06 | 57 |
| Comparative Example 3 | None | 2.1 | 510 | 490 | 510 | 130 | 100 | 123 | 100 | 130 | 77% | 4.60E−05 | 105 |
| Comparative Example 4 | None | 2.1 | 490 | 460 | 500 | 76 | 52 | 74 | 52 | 76 | 68% | 8.20E−06 | 63 |
| Comparative Example 5 | None | 2.1 | 550 | 530 | 430 | 361 | 210 | 31 | 31 | 361 | 9% | 5.10E−05 | 65 |

Lower electrode film ⇔ Upper electrode film

The invention claimed is:

1. A thin film piezoelectric element comprising a potassium sodium niobate thin film having a structure in which a plurality of crystal grains are present in a film thickness direction; and a pair of electrode films sandwiching the potassium sodium niobate thin film,
wherein when the potassium sodium niobate thin film is divided into three regions of the same thickness in the film thickness direction and average crystal grain sizes $A_1$, $A_2$, and $A_3$ of the respective regions are determined, a ratio m/M of the smallest average crystal grain size m among $A_1$, $A_2$, and $A_3$ to the largest average crystal grain size M among $A_1$, $A_2$, and $A_3$ is 10% to 80% and
the region having the smallest average crystal grain size m lies next to one of the pair of electrode films.

2. The thin film piezoelectric element according to claim 1, wherein the region having the largest average crystal grain size M does not lie next to either one of the pair of electrode films.

3. The thin film piezoelectric element according to claim 1, wherein the smallest average crystal grain size m among the regions of the potassium sodium niobate thin film is 60 nm or more and 90 nm or less and the largest average crystal grain size M is 100 nm or more.

4. The thin film piezoelectric element according to claim 1, wherein the potassium sodium niobate thin film contains Mn (manganese).

5. The thin film piezoelectric element according to claim 1, wherein the potassium sodium niobate thin film contains at least three elements selected from Li (lithium), Sr (strontium), Ba (barium), Zr (zirconium), and Ta (tantalum).

6. A thin film piezoelectric actuator comprising the thin film piezoelectric element according to claim 1.

7. A thin film piezoelectric sensor comprising the thin film piezoelectric element according to claim 1.

8. A hard disk drive comprising the thin film piezoelectric actuator according to claim 6.

9. An ink jet printer comprising the thin film piezoelectric actuator according to claim 6.

* * * * *